United States Patent [19]

Hu et al.

[11] Patent Number: 5,734,277

[45] Date of Patent: Mar. 31, 1998

[54] OUTPUT CIRCUIT AND METHOD FOR SUPPRESSING SWITCHING NOISE THEREIN

[75] Inventors: Tzu-Hui P. Hu, Tempe; Barry B. Heim, Mesa, both of Ariz.

[73] Assignee: Motorola, Inc., Schaumburg, Ill.

[21] Appl. No.: 595,436

[22] Filed: Feb. 5, 1996

[51] Int. Cl.⁶ .................................................. H03B 1/00
[52] U.S. Cl. ........................ 327/108; 327/170; 326/87
[58] Field of Search .............................. 326/15, 31, 33, 326/85, 87, 88, 91, 92; 327/108, 109, 110, 111, 112, 170

[56] References Cited

U.S. PATENT DOCUMENTS

| | | | |
|---|---|---|---|
| 4,498,021 | 2/1985 | Uya | 307/443 |
| 4,725,747 | 2/1988 | Stein et al. | 307/579 |
| 4,890,015 | 12/1989 | Wise | 307/443 |
| 4,918,339 | 4/1990 | Shigeo et al. | 327/170 |
| 4,959,561 | 9/1990 | McDermott et al. | 307/443 |
| 4,961,010 | 10/1990 | Davis | 307/443 |
| 4,970,419 | 11/1990 | Hagen et al. | 307/542 |
| 5,036,222 | 7/1991 | Davis | 307/443 |
| 5,055,714 | 10/1991 | Obregon | 307/443 |
| 5,089,722 | 2/1992 | Amedeo | 326/87 |
| 5,103,118 | 4/1992 | Peterson | 307/443 |
| 5,220,209 | 1/1993 | Seymour | 326/87 |
| 5,231,311 | 7/1993 | Ferry et al. | 326/87 |
| 5,315,172 | 5/1994 | Reddy | 327/170 |
| 5,317,206 | 5/1994 | Hanibuchi et al. | 327/170 |
| 5,483,188 | 1/1996 | Frodsham | 327/108 |

Primary Examiner—Timothy P. Callahan
Assistant Examiner—Jeffrey Zweizig
Attorney, Agent, or Firm—Ziye Zhou; Rennie William Dover

[57] ABSTRACT

An output circuit (40) includes pull-up transistor (12), two pull-down transistors (14, 16), and a noise suppression circuit (58). When an input node (50) of the output circuit (40) switches to a logic high voltage, the pull-up transistor (12) is switched off. A first transistor (22) in the noise suppression circuit (58) is switched on, discharges a capacitive load (32) coupled to an output node (60) of the output circuit (40), and charges a capacitor formed by a second transistor (24) in the noise suppression circuit (58). After a time delay, the two pull-down transistors (14, 16) are switched on sequentially and establish two current paths from the output node (60) to ground (25). Then, a third transistor (56) in the noise suppression circuit (58) is switched on, discharges the capacitor (24), and establishes a third current path from the output node (60) to ground.

20 Claims, 2 Drawing Sheets

OUTPUT CIRCUIT AND METHOD FOR SUPPRESSING SWITCHING NOISE THEREIN

BACKGROUND OF THE INVENTION

The present invention relates, in general, to an output circuit and, in particular, to an output circuit that includes a circuit for suppressing switching noise.

Typically, a logic circuit, such as, for example, a transistor-transistor logic (TTL) circuit, includes an output circuit that provides a high output impedance and a large fan out capability. When the voltage at the input of the output circuit switches from one logic state to another logic state, a current is generated within the output circuit. The generated current induces a voltage in a parasitic inductance present in a bonding wire between a power supply bonding pad of the semiconductor chip that includes the output circuit and a corresponding lead in the leadframe of the chip.

When the output voltage of the output circuit is switched from a high logic state to a low logic state, the induced voltage is referred to as switching noise or, more particularly, as ground bounce. Ground bounce causes the voltage at the output to oscillate around ground voltage. In logic circuits, a logic low state is defined as a voltage level lower than a predetermined voltage, e.g., 0.8 volt for TTL logic circuits. Ground bounce may raise the output voltage above the predetermined voltage, resulting in the output circuit transmitting an incorrect logic output signal.

Ground bounce can be suppressed by reducing the lead inductance from the bonding pad to the lead. One approach uses a plurality of bonding wires for the power supply of the output circuit. Because the plurality of bonding wires are in parallel with each other, the total lead inductance is reduced. Another approach places the power supply leads to the center of the leadframe to shorten the length of the bonding wire, thereby reducing the lead inductance. However, both approaches will increase the complexity and the cost of packaging. Furthermore, the approach of placing the power supply leads to the center of the leadframe does not comply with the industry standard for leadframe pin outs. Ground bounce can also be suppressed by reducing the rate of change in the current flowing through the output circuit to the power supply lead during switching. One approach uses serpentine shaped polysilicon gates for the transistors in the output circuit. The transistors having serpentine shaped polysilicon gates are switched on gradually when the input voltage of the output circuit switches. Thus, the rate of change in the current in the output circuit is reduced. However, this approach increases the response time of the output circuit and significantly degrades the switching characteristics and the high frequency performance of the output circuit.

Accordingly, it would be advantageous to have an output circuit and a method for suppressing ground bounce in the output circuit. It is desirable for ground bounce to be suppressed without modifying the packaging process and without significantly degrading the switching characteristics of the output circuit.

DETAILED DESCRIPTION OF THE DRAWINGS

Figure 1:
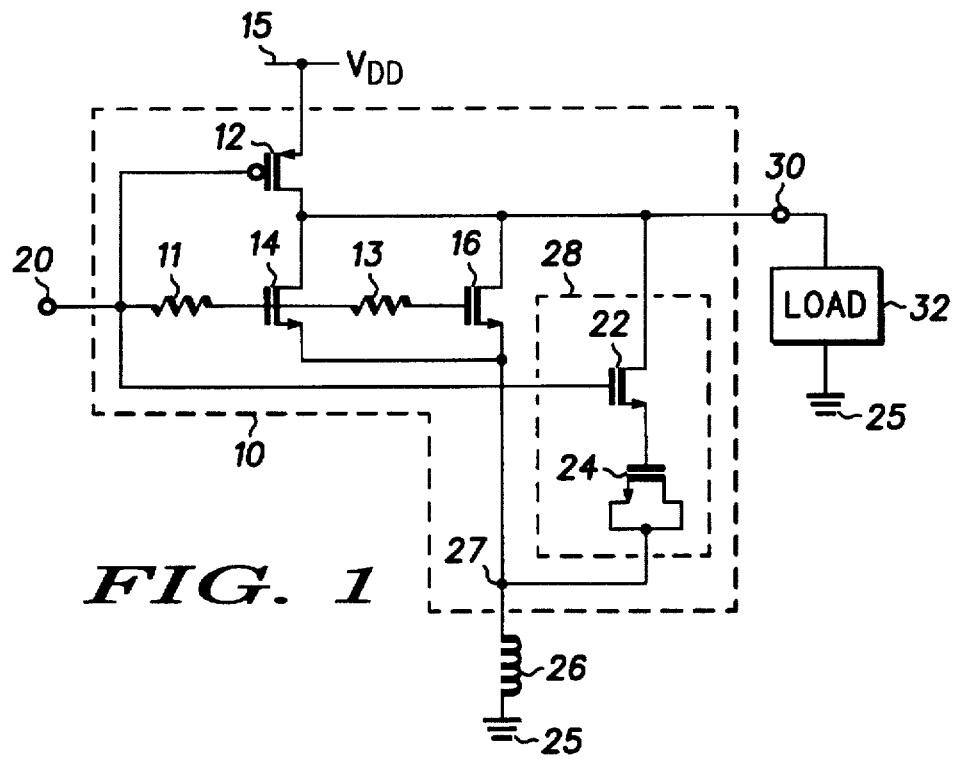
FIG. 1 is a schematic diagram of an output circuit in accordance with a first embodiment of the present invention.

FIG. 1 is a schematic diagram of an output circuit 10 in accordance with a first embodiment of the present invention. It should be noted that output circuit 10 is also referred to as an output buffer or an output buffer circuit. Output circuit 10 includes a p-channel insulated gate field effect transistor (FET) 12 and n-channel insulated gate FETs 14 and 16. FET 14 is designed to have a smaller current conducting capacity than FET 16. A gate electrode of FET 12 is connected to an electrode of a resistor 11, forming an input node 20 of output circuit 10. Another electrode of resistor 11 is connected to a gate electrode of FET 14. A source electrode of FET 12 is connected to a biasing node 15 for receiving a voltage such as, for example, a supply voltage $V_{DD}$. A source electrode of FET 14 is coupled to a ground 25 for receiving a voltage such as, for example, ground voltage via a parasitic inductor 26 between a bonding pad of the integrated circuit chip and a corresponding lead in the leadframe of the chip. A drain electrode of FET 14 is connected to a drain electrode of FET 12. A resistor 13 has one electrode connected to the gate electrode of FET 14 and another electrode connected to a gate electrode of FET 16. A source electrode of FET 16 is connected to the source electrode of FET 14, thereby forming a node 27. A drain electrode of FET 16 is connected to the drain electrode of PET 12, thereby forming an output node 30 for transmitting an output signal of output circuit 10.

Output circuit 10 further includes n-channel insulated gate FETs 22 and 24. FET 22 has a gate electrode connected to the gate electrode of FET 12, a source electrode connected to a gate electrode of FET 24, and a drain electrode connected to the drain electrode of FET 16. A source electrode and a drain electrode of FET 24 are connected to node 27.

Although FETs 12, 14, 16, 22, and 24 in output circuit 10 are described as insulated gate FETs in FIG. 1, this is not intended as a limitation of the present invention. FETs 12, 14, 16, and 22 serve as switches and can be replaced with other types of switching devices having control electrodes and current conducting electrodes, e.g., bipolar transistors. When using a transistor as a switching device, those skilled in the art are aware that for a field effect transistor, a gate electrode serves as a control electrode, and source and drain electrodes serve as current conducting electrodes. Likewise, for a bipolar transistor, a base electrode serves as a control electrode, and emitter and collector electrodes serve as current conducting electrodes. It should be noted that FET 24 serves as a capacitive element and can be replaced with a capacitive device such as, for example, a capacitor, a diode, a bipolar transistor, or the like.

FETs 12, 14, and 16 are drive transistors which determine the fan out capability of output circuit 10. More particularly, FET 12 is a pull-up transistor and FETs 14 and 16 are pull-down transistors. When an input signal at input node 20 is at a logic high voltage level, FET 12 is non-conductive and FETs 14 and 16 are conductive. FETs 14 and 16 pull the voltage at output node 30 to a logic low voltage level, e.g., ground. When the input signal at input node 20 is at a logic low voltage level, FET 12 is conductive and FETs 14 and 16 are non-conductive. FET 12 pulls the voltage at output node 30 to a logic high voltage, e.g., $V_{DD}$. FETs 22 and 24 form a noise suppression circuit 28 which suppresses the switching noise in output circuit 10 when the output signal at output node 30 switches from a logic high voltage level to a logic low voltage level.

A load 32 is coupled to output node 30 of output circuit 10. Load 32 includes any number of circuits that are coupled in parallel with each other and receive the output signal of output circuit 10. The maximum number of circuits that can be included in load 32 is determined by the fan out capability of output circuit 10. Load circuits are well known in the art. When the voltage at output node 30 changes from a logic high voltage level to a logic low voltage level, a load discharging current starts to flow from load 32 to ground via output node 30 and output circuit 10. The change in the load discharging current may generate ground bounce in an output circuit. If load 32 has a small input resistance and a large input capacitance, the load discharging current increases at a high rate during switching, which may generate a large ground bounce in an output circuit. If load 32 includes a plurality of load circuits coupled in parallel with one another, the total input capacitance of load 32 is equal to sum of the values of the input capacitance of each individual load circuit, and the total input resistance of load 32 to is equal to the reciprocal of the sum of the reciprocals of the input resistance of each individual load circuit. Therefore, a large fan out results in a large input capacitance and a small input resistance of load 32, which may generate a large ground bounce in an output circuit.

When the input signal at input node 20 switches from a logic low voltage level to a logic high voltage level, FET 12 is switched off and FET 22 is switched on. A current path from $V_{DD}$ at biasing node 15 to output node 30 via FET 12 is open. A current flowing through FET 22 discharges load 32 and charges FET 24. The current flowing through FET 22 reduces the charge stored in the input capacitance of load 32. FET 14 is switched on after a time delay determined by the resistance of resistor 11 and the gate-source capacitance of FET 14. A current flowing through FET 14 also discharges load 32 by establishing a current path from output node 30 to ground via node 27 FET 16 is switched on to further discharge load 32 after another time delay determined by the resistance of resistors 11 and 13 and the gate-source capacitance of FET 16. The currents flowing through FETs 22, 14, and 16 pull the voltage at output node 30 to ground.

During the switching process, the charge stored in the input capacitance of load 32 while the output node 30 was at a logic high voltage level is first reduced by the current flowing through FET 22 to the gate electrode of FET 24. Inductor 26 and the capacitance of FET 24 form a series inductor-capacitor (LC) circuit. In an LC circuit, the polarity of the voltage across the capacitor is opposite to the polarity of the voltage across the inductor. Thus, the capacitance of FET 24 tends to balance the effect of the inductor 26 and reduces ground bounce in output circuit 10. When FETs 14 and 16 are switched on, load 32 is already partially discharged, which results in a smaller rate of change in the current than that flowing through an output circuit which does not include noise suppression circuit 28. Furthermore, FET 14 is designed to have a smaller current conducting capacity than FET 16. FET 14 is switched on and conducts a small current to ground before FET 16 is switched on, thereby further reducing the rate of increase in the current flowing to ground. These features contribute to a suppressed ground bounce in output circuit 10.

Because FET 22 starts to discharge load 32, which is coupled to output node 30, immediately after the voltage at input node 20 switches to the logic high voltage, output circuit 10 has a high switching speed, e.g., approximately two nano-seconds, and a good high frequency performance.

The performance parameters of output circuit 10, such as switching speed, noise level, etc., can be optimized by adjusting the circuit parameters of output circuit 10, such as the current conducting capacities of FETs 14, 16, and 22, the time delays before FETs 14 and 16 are switched on, the and capacitance of FET 24.

It should be understood that resistors 11 or 13 in output circuit 10 may be replaced by a metal or polysilicon trace having an intrinsic resistance. The electrical conductivity and the cross sectional area of the trace can be adjusted to realize an intrinsic resistance of the trace for desired delay times before FETs 14 and 16 are switched on. Furthermore, in accordance with the present invention, resistor 11 and FET 14 are optional. In an output circuit which does not include resistor 11 and FET 14, but is otherwise identical to output circuit 10, FET 16 is switched on after FET 22 is switched on. It should be noted that preferably there is a time delay between when FET 22 switches on and when FET 16 switches on. The performance of an output circuit which does not include resistor 11 and FET 14 is optimized by adjusting the gate-source capacitance and the current conducting capacity of FET 16, the resistance of resistor 13, and the capacitance of FET 24.

Figure 2:
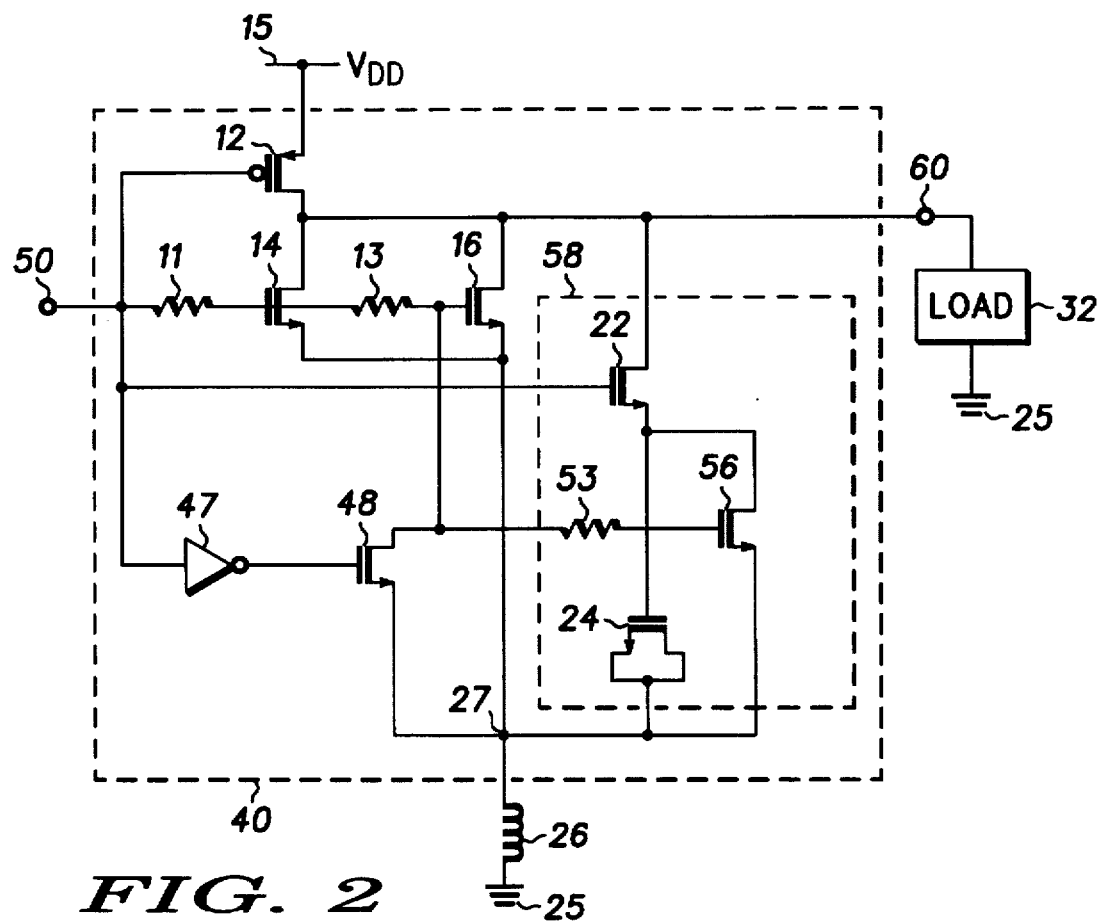
FIG. 2 is a schematic diagram of an output circuit in accordance with a second embodiment of the present invention.

FIG. 2 is a schematic diagram of an output circuit 40 in accordance with a second embodiment of the present invention. Output circuit 40 includes all components in output circuit 10 of FIG. 1. It should be understood that the same reference numerals are used in the figures to denote the same elements. The gate electrode of FET 12 serves as an input node 50 for receiving an input signal of output circuit 40. The drain electrodes of FETs 12, 14, and 16 are connected together to form an output node 60 for transmitting an output signal of output circuit 40. Load 32 is coupled to output node 60.

In addition, output circuit 40 includes a drive circuit 47, a resistor 53, and n-channel insulated gate FETs 48 and 56. By way of example, drive circuit 47 is an inverter having an input connected to the gate electrode of FET 12 and an output connected to a gate electrode of FET 48. A source electrode of FET 48 is connected to the source electrode of FET 16. A drain electrode of FET 48 is connected to the gate electrode of FET 16. A gate electrode of FET 56 is coupled to the gate electrode of FET 16 via resistor 53. A source electrode of FET 56 is connected to the source and drain electrodes of FET 24. A drain electrode of FET 56 is connected to the gate electrode of FET 24.

FETs 48 and 56 serve as switches and can be replaced with other types of switching devices having control electrodes and current conducting electrodes, e.g., bipolar transistors. Like resistors 11 and 13, resistor 53 may be replaced by a metal or polysilicon trace.

FETs 12, 14, and 16 are drive transistors which determine the fan out capability of output circuit 40. More particularly, FET 12 is a pull-up transistor and FETs 14 and 16 are pull-down transistors. When an input signal at input node 50 is at a logic high voltage level, FET 12 is non-conductive and FETs 14 and 16 are conductive. FETs 14 and 16 pull the voltage at output node 60 to ground. When the input signal at input node 50 is at a logic low voltage level, FET 12 is conductive and FETs 14 and 16 are non-conductive. FET 12 pulls the voltage at output node 60 to a logic high voltage. $V_{DD}$ FETs 22, 24, and 56 and resistor 53 form a noise suppression circuit 58 which suppresses the switching noise in output circuit 40 when the output signal at output node 60 switches from a logic high voltage level to a logic low voltage level. Drive circuit 47 and FET 48 provide a current path from the gate electrode of FET 16 to the source electrode of FET 16 when the input signal at input node 50 switches from a logic high voltage level to a logic low voltage level, thereby increasing the speed at which FET 16 is switched off as well as the switching speed of output circuit 40.

When the input signal at input node 50 switches from a logic low voltage level to a logic high voltage level, the operation of FETs 12, 14, 16, 22, and 24 in output circuit 40 is analogous to the operation of corresponding FETs in output circuit 10 of FIG. 1. After FET 16 is switched on, FET 56 is switched on. The time delay before FET 56 is switched on is determined by the resistance of resistors 11, 13, and 53 and the gate capacitance of FET 56. FET 56 discharges the charge accumulated in FET 24 and provides a current path from output node 60 via FET 22 to ground via node 27. A current flowing through FETs 22 and 56 further pulls down the voltage at output node 60. The currents flowing through FETs 14, 16, and 56 continue until the voltage at output node 30 is pulled to ground.

In the process of switching the voltage at output node 60 from a logic high voltage level to a logic low voltage, FET 56 is switched on to maintain the current flowing from output node 60 to ground via node 27 when the current flowing through FET 16 approaches the current conducting capacity of FET 16. The current flowing through FETs 22 and 56 prevents the current flowing to ground 25 from decreasing. A lower rate of change in the current flowing to ground via node 27 generates a smaller voltage across inductor 26. Therefore, ground bounce is suppressed.

Because FET 22 discharges load 32, which is coupled to output node 60, immediately after the voltage at input node 50 switches to the logic high voltage, output circuit 40 has a high switching speed, e.g., approximately two nanoseconds, and a good high frequency performance. The performance parameters of output circuit 40, such as switching speed, noise level, etc. can be optimized by adjusting the circuit parameters of output circuit 40, such as the current conducting capacities of FETs 14, 16, 22, and 56, the time delays before switching on FETs 14, 16, and 56, and the capacitance of FET 24.

When the input signal at input node 50 switches from a logic high voltage level to a logic low voltage level, FET 12 is switched to a conductive state, thereby establishing a current path from biasing node 15 to output node 60. Because the gate electrode of FET 22 is directly connected to input node 50, FET 22 is switched to a non-conductive state. Drive circuit 47 generates a logic high voltage at the gate electrode of FET 48, which is then switched on. A current path from the gate electrode to the source electrode of FET 16 via FET 48 switches FET 16 off. After a time delay determined by the resistance of resistor 11 and the gate capacitance of FET 14, FET 14 is switched off. FET 14 is switched off after a time delay determined by its gate capacitance and the resistance of resistor 11. The voltage at output node 60 is pulled to the supply voltage $V_{DD}$, because FET 12 is conductive and FETs 14, 16, and 22 are non-conductive.

FET 22 is switched off when the voltage at input node 50 switches from the logic high voltage to the logic low voltage because the gate electrode of FET 22 is directly connected to input node 50. FET 16 is switched off after a time delay determined by the switching speed of drive circuit 47 and the threshold voltage of FET 48. FET 48 discharges the charge accumulated on the gate electrode of FET 16, thereby increasing the speed at which FET 16 is switched off. Thus, FET 48 serves as a discharging transistor for FET 16. In an output circuit which does not include drive circuit 47 and FET 48, but is otherwise identical to output circuit 40, FET 16 stays in the conductive state for a time interval determined by the resistance of resistors 11 and 13 and the gate capacitance of FET 16 after input node 50 switches from the logic high to the logic low voltage level. This time interval is typically longer than the switching time of drive circuit 47. Therefore, drive circuit 47 and FET 48 increase the speed at which FET 16 is switched off as well as the switching speed of output circuit 40. It should be noted that FET 14 stays in the conductive state for a time interval after input node 50 switches to a logic low voltage level. This time interval is determined by the resistance of resistor 11 and the gate capacitance of FET 14. However, FET 14 typically does not significantly affect the switching speed of output circuit 40 because FET 14 has a small current conducting capacity compared with FETs 16 and 22. It should also be noted that FET 56 stays in the conductive state for a time interval after input node 50 switches to a logic low voltage level. This time interval is determined by the switching time of drive circuit 47, the resistance of resistor 53, and the gate capacitance of FET 56. Because FETs 22 and 56 are connected in series between output node 60 and node 25, the current flowing through FET 56 stops flowing as soon as FET 22 is switched off. Therefore, the state of FET 56 does not affect the switching speed of output circuit 40 when output node 60 is switched from a logic low voltage level to a logic high voltage level.

Figure 3:
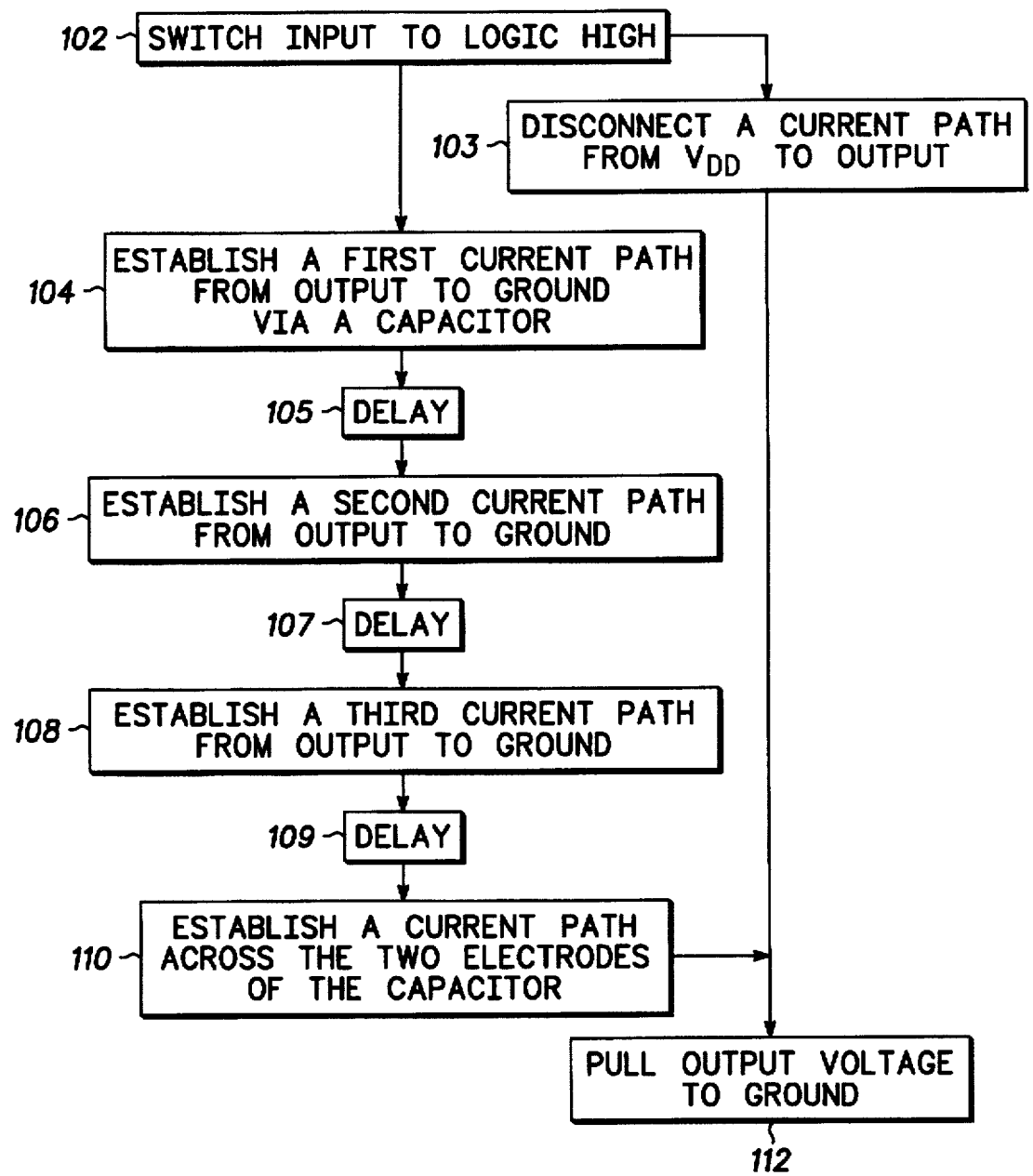
FIG. 3 is a flow chart of a method for suppressing switching noise in an output circuit in accordance with an embodiment of the present invention.

FIG. 3 is a flow chart 100 of a method for suppressing the switching noise in an output circuit, e.g., output circuits 10 and 40 of FIGS. 1 and 2, respectively, during a high to low transition at its output. With reference to FIG. 2, when the voltage at input node 50 of output circuit 40 switches from a logic low voltage level to a logic high voltage level (step 102), the pull-up switch, FET 12, is switched off, thereby opening a current path from supply voltage $V_{DD}$ at biasing node 15 to output node 60 (step 103).

The logic high voltage at input node 50 switches FET 22 on. FET 22 establishes a first current path from output node 60 to the gate electrode of FET 24, which serves as a capacitor coupled between the source electrode of FET 22 and ground at ground 25 (step 104). The first current path reduces the charge on a capacitive load coupled to output node 60 and stores the charge in the capacitor formed by FET After a delay of a first time interval (step 105), the first pull-down transistor, FET 14, is switched on and establishes a second current path from output node 60 to ground via node 27 (step 106). When the second current path is established, load 32, which is coupled to output node 60, is already partially discharged through the first current path. Therefore the rate of increase in the current flowing to ground 25 is reduced compared with the case in which the second current path is established without discharging load 32 via the first current path.

After a delay of a second time interval (step 107), the second pull-down transistor, FET 16, is switched on and establishes a third current path parallel to the second current path through FET 14 (step 108). FET 16 has a larger current conducting capacitor than FET 14. Therefore, the current flowing from output node 60 to ground via node 27 increases gradually.

After a delay of a third time interval (step 109), FET 56 is switched on to establish a current path between the gate electrode of FET 24 and ground at ground 25 (step 110).

FET 56 removes the charge accumulated on the gate electrode of FET 24 and establishes a current path via FET 22 to further pull down the voltage at output node 60.

With the pull-up transistor open (step 103) and pull-down transistors closed (steps 106 and 108), the voltage at output node 60 is pulled to ground (step 112).

By following flow chart 100, the rate of change in the current flowing from output node 60 to ground 25 of output circuit 40 is suppressed when the voltage at output node 60 is switched from a logic high voltage to a logic low voltage level. A suppressed rate of change in the current generates a suppressed voltage across inductor 26. Therefore, the switching noise in output circuit 40 is suppressed. Because FET 22 discharges load 32, which is coupled to output node 60, immediately after the voltage at input node 50 switches to the logic high voltage, output circuit 40 has a high switching speed and a good high frequency performance.

By now it should be appreciated that an output circuit and a method for suppressing ground bounce in the output circuit have been provided. In accordance with the present invention, ground bounce is suppressed by using a noise suppression circuit in the output circuit. Therefore, special packaging is not required. An integrated circuit chip which includes the output circuit of the present invention can be packaged using a cost effective packaging process which conforms with industry standards. Furthermore, the output circuit of the present invention suppresses ground bounce and maintains a high switching speed, thereby providing good high frequency characteristics.

We claim:

1. An output circuit, comprising:
    a first transistor having a control electrode coupled for receiving an input signal, a first current conducting electrode coupled for receiving a first voltage, and a second current conducting electrode coupled for transmitting an output signal;
    a second transistor having a control electrode, a first current conducting electrode coupled for receiving a second voltage, and a second current conducting electrode coupled to the second current conducting electrode of the first transistor;
    a first delay element having a first end coupled to the control electrode of the first transistor, and a second end coupled to the control electrode of the second transistor;
    a third transistor having a control electrode coupled to the control electrode of the first transistor, a first current conducting electrode, and a second current conducting electrode coupled to the second current conducting electrode of the first transistor; and
    a capacitive element having a first electrode coupled to the first current conducting electrode of the third transistor and a second electrode coupled to the first current conducting electrode of the second transistor.

2. The output circuit of claim 1, wherein the capacitive element includes an insulated gate field effect transistor having a control electrode serving as the first electrode of the capacitive element, and a first current conducting electrode and a second current conducting electrode coupled together and serving as the second electrode of the capacitive element.

3. The output circuit of claim 1, wherein the first delay element includes a resistor having a first electrode coupled to the control electrode of the first transistor and a second electrode coupled to the control electrode of the second transistor.

4. The output circuit of claim 1, further comprising:
    a second delay element for coupling the first end of the first delay element to the control electrode of the first transistor, the second delay element having a first end coupled to the control electrode of the first transistor and a second end coupled to the first end of the first delay element; and
    a fourth transistor having a control electrode coupled to the first end of the first delay element, a first current conducting electrode coupled to the first current conducting electrode of the second transistor, and a second current conducting electrode coupled to the second current conducting electrode of the second transistor.

5. The output circuit of claim 4, wherein the second delay element includes a resistor having a first electrode coupled to the control electrode of the first transistor and a second electrode coupled to the first end of the first delay element.

6. The output circuit of claim 5, wherein the first transistor is a p-channel insulated gate field effect transistor, and the second transistor, the third transistor, and the fourth transistor are n-channel insulated gate field effect transistors.

7. The output circuit of claim 1, further comprising:
    a fourth transistor having a control electrode, a first current conducting electrode coupled to the first current conducting electrode of the second transistor, and a second current conducting electrode coupled to the first current conducting electrode of the third transistor; and
    a second delay element having a first end coupled to the control electrode of the second transistor, and a second end coupled to the control electrode of the fourth transistor.

8. The output circuit of claim 7,
    wherein the second delay element includes a resistor having a first electrode coupled to the control electrode of the second transistor and a second electrode coupled to the control electrode of the fourth transistor.

9. The output circuit of claim 1, further comprising:
    a drive circuit having an input coupled to the control electrode of the first transistor, and an output; and
    a fourth transistor having a control electrode coupled to the output of the drive circuit, a first current conducting electrode coupled to the first current conducting electrode of the second transistor, and a second current conducting electrode coupled to the control electrode of the second transistor.

10. The output circuit of claim 9, wherein the drive circuit includes an inverter and the fourth transistor is an n-channel insulated gate field effect transistor.

11. An output circuit, comprising:
    a first drive transistor having a control electrode coupled for receiving an input signal, a first current conducting electrode coupled for receiving a first voltage, and a second current conducting electrode coupled for transmitting an output signal;
    a first resistor having a first electrode coupled to the control electrode of the first drive transistor, and a second electrode;
    a second drive transistor having a control electrode coupled to the second electrode of the first resistor, a first current conducting electrode coupled for receiving a second voltage, and a second current conducting electrode coupled to the second current conducting electrode of the first drive transistor;
    a second resistor having a first electrode coupled to the second electrode of the first resistor, and a second electrode;

a third drive transistor having a control electrode coupled to the second electrode of the second resistor, a first current conducting electrode coupled to the first current conducting electrode of the second drive transistor, and a second current conducting electrode coupled to the second current conducting electrode of the second drive transistor;

a first transistor having a control electrode coupled to the control electrode of the first drive transistor, a first current conducting electrode, and a second current conducting electrode coupled to the second current conducting electrode of the first drive transistor;

a capacitive element having a first electrode coupled to the first current conducting electrode of the first transistor and a second electrode coupled to the first current conducting electrode of the second drive transistor;

a third resistor having a first electrode coupled to the control electrode of the third drive transistor, and a second electrode; and a second transistor having a control electrode coupled to the second electrode of the third resistor, a first current conducting electrode coupled to the first current conducting electrode of the second drive transistor, and a second current conducting electrode coupled to the first current conducting electrode of the first transistor.

12. The output circuit of claim 11, wherein the capacitive element includes an insulated gate field effect transistor having a control electrode serving as the first electrode of the capacitive element, and a first current conducting electrode and a second current conducting electrode coupled together and serving as the second electrode of the capacitive element.

13. The output circuit of claim 11, wherein the first drive transistor is a p-channel insulated gate field effect transistor, and the second drive transistor, the third drive transistor, the first transistor, and the second transistor are n-channel insulated gate field effect transistors.

14. The output circuit of claim 11, further comprising:

an inverter having an input coupled to the control electrode of the first drive transistor, and an output; and a discharging transistor having a control electrode coupled to the output of the inverter, a first current conducting electrode coupled to the first current conducting electrode of the third drive transistor, and a second current conducting electrode coupled to the control electrode of the third drive transistor.

15. The output circuit of claim 14, wherein the discharging transistor is an n-channel insulated gate field effect transistor.

16. A method for suppressing switching noise in an output circuit, comprising the steps of:

coupling a first biasing node of the output circuit for receiving a first voltage;

coupling a second biasing node of the output circuit for receiving a second voltage;

opening a current path from the first biasing node to an output node of the output circuit in response to an input signal switching from a first logic voltage level to a second logic voltage level;

establishing a first current path from the output node to the second biasing node via a capacitive element in response to the input signal switching from the first logic voltage level to the second logic voltage level;

delaying a first time interval after the step of establishing a first current path; and establishing a second current path from the output node to the second biasing node after the step of delaying a first time interval.

17. The method for suppressing switching noise in an output circuit as claimed in claim 16, further comprising the steps of:

delaying a second time interval after the step of establishing a second current path; and establishing a current path from a first electrode to a second electrode of the capacitive element after the step of delaying a second time interval.

18. The method for suppressing switching noise in an output circuit as claimed in claim 16, further comprising the steps of:

delaying a second time interval after the step of establishing a first current path, wherein the second time interval is shorter than the first time interval; and establishing a third current path from the output node to the second biasing node after the step of delaying a second time interval and before the step of establishing a second current path.

19. The method for suppressing switching noise in an output circuit as claimed in claim 16, further comprising the steps of:

opening the first current path in response to the input signal switching from the second logic voltage level to the first logic voltage level;

opening the second current path in response to the input signal switching from the second logic voltage level to the first logic voltage level;

and establishing the current path from the first biasing node to the output node in response to the input signal switching from the first logic voltage level to the second logic voltage level.

20. The method for suppressing switching noise in an output circuit as claimed in claim 19, wherein the step of opening the second current path further includes the step of switching off a transistor in the second current path by establishing a current path between a control electrode of the transistor and a current conducting electrode of the transistor.

* * * * *